United States Patent
Kang et al.

(10) Patent No.: US 6,883,128 B2
(45) Date of Patent: Apr. 19, 2005

(54) PC AND ATE INTEGRATED CHIP TEST EQUIPMENT

(75) Inventors: Jong-Gu Kang, Suwon (KR); Jong-Hyun Kim, Suwon (KR)

(73) Assignee: UniTest Incorporation, Yoingin (KR)

( * ) Notice: Subject to any disclaimer, the term of this patent is extended or adjusted under 35 U.S.C. 154(b) by 428 days.

(21) Appl. No.: 10/214,846

(22) Filed: Aug. 8, 2002

(65) Prior Publication Data

US 2003/0226076 A1 Dec. 4, 2003

(30) Foreign Application Priority Data

May 30, 2002 (KR) .................................. 10-2002-0030312

(51) Int. Cl.[7] .................................................. G06F 11/00
(52) U.S. Cl. ...................................... 714/738; 714/718
(58) Field of Search ........................ 714/734, 42, 738, 714/718; 702/117; 209/573; 716/4

(56) References Cited

U.S. PATENT DOCUMENTS

| | | | | |
|---|---|---|---|---|
| 5,164,663 A | * | 11/1992 | Alcorn | ....................... 714/734 |
| 6,324,485 B1 | * | 11/2001 | Ellis | ........................... 702/117 |
| 6,351,827 B1 | * | 2/2002 | Co et al. | ...................... 714/42 |
| 6,365,859 B1 | * | 4/2002 | Yi et al. | ..................... 209/573 |
| 6,594,802 B1 | * | 7/2003 | Ricchetti et al. | ............... 716/4 |

* cited by examiner

*Primary Examiner*—David Ton
(74) *Attorney, Agent, or Firm*—Mayer, Brown, Rowe & Maw LLP

(57) ABSTRACT

The present invention relates to a test equipment of a chip memory device. A memory pattern test is implemented using a pattern generation substrate in which a processor is designed in an EPLD for thereby implementing a PC test and pattern programming, so that a test evaluated under a PC environment formed of a CPU and chip sets. Two processes of a chip device test and automatic test are performed in one equipment using a generated test pattern. The PC test and automatic test are separated using a high speed switching device which is capable of implementing a conversion without a signal distortion between the signal lines extended from the chip sets and the pattern generation substrate. Therefore, in the present invention, it is possible to enhance a test performance and decrease the test time and error ratio and cost of the products.

4 Claims, 3 Drawing Sheets

PC AND ATE INTEGRATED CHIP TEST EQUIPMENT

BACKGROUND OF THE INVENTION

1. Field of the Invention

The present invention relates to a PC(Personal Computer) and ATE(Automatic Test Equipment) integrated chip test equipment, and in particular to a PC and ATE integrated chip test equipment which is capable of generating a pattern test using a PC test and a pattern generation board for a semiconductor chip test and outputting to a memory for thereby concurrently performing two processes in one equipment based on an integrated automatic test.

2. Description of the Background Art

FIG. 1 is a view illustrating the construction of a system in which an equipment for testing a memory module during a PC test in the conventional art(Korean Lain-open Number 2002-0004387).

The above system includes a programmable power voltage supply unit 110 for setting a VIH/VIL level to a user's level and supplying the same, a level checking unit 120 for reading a voltage for checking the changed level, an address input unit 130 for designating an address of a memory which will be tested before a memory module test is performed and selecting an I/O address of a board to which the voltage levels of the VIH and VIL are applied, a signal selection unit 140 for receiving an output signal which selects an I/O address of a board to which the voltage levels of the VIH and VIL are applied from the address input unit 130 and selectively outputting a changed level voltage from the power voltage supply unit 110 and a normal state voltage from a chip set unit 200, a test result checking unit 150 for judging whether the test is passed or failed as a result of the test, a chip set unit 200 for applying a normal state voltage, and a memory module unit 300 for performing a test.

The level checking unit 120 is formed of 12-bit and includes an analog/digital converter capable of reading a 4-bit first and then reading the remaining 8-bit.

When the test is started, an externally applied voltage is changed to a voltage of a user's VIH and VIL level by the power voltage supply equipment 110. In order to check the changed voltage level, the level checking unit 120 formed of the analog/digital converter checks the changed voltage level, and the changed voltage level is applied to the signal selection unit 140.

Next, the signal selection unit 140 receives an address of a memory, which will be tested in the address input unit 130 and an I/O address of a board to which the changed VIH and VIL voltage levels are applied, from a first output signal(A) and a second output signal(B), respectively. Thereafter, the signal selection unit 140 selectively applies a normal state voltage and a changed level voltage to the memory module unit 300 for thereby performing a test.

In the above system, when a PC test of the memory module is performed, the voltage levels of the VIH and VIL of the signals applied to the memory are programmable-changed, so that it is judged whether the test of the memory is passed or failed at the PC level. Since the memory controller which is called as a chip set, can not directly access a memory without a CPU instruction which is allowed by the PC, the address of the memory which will be tested, must be designated before the memory module test is performed. Therefore, there are many problems for accessing a desired data at a certain address and a certain timing for implementing an accurate test of a chip.

FIG. 2 is a block diagram illustrating a system for explaining a test method of a chip equipment in a conventional art(Korean Laid-open Number 2001-0062640).

The above chip equipment includes a PC equipment 201 having a chip equipment 210, a logic analyzer 202 for trigging and obtaining a signal waveform of a terminal(pin) group of the chip equipment 210 as a certain fail information, a pattern generation equipment 203 for inputting a signal waveform data(trace data) obtained from the logic analyzer 202 and converting to a test pattern of a desired test equipment and outputting the same, an automatic test equipment(ATE) 204 for testing a chip equipment as a tested device(DUT) 204-1 using a test pattern from the pattern generation equipment 203 and judging whether an error occurs in the PC equipment, and a mass production ATE 205 for testing the products same as the chip equipment 210 mounted in the PC equipment 201 as a tested device (DUT) 205-1.

In the above conventional art, a test pattern is generated based on a trace data of an operation state of a chip equipment mounted in a PC equipment for thereby testing a tested device.

A data extracted from a logic analyzer is capable of only a small amount of a timing pattern which occurs in the PC. Even when a desired amount of the timing pattern is extracted, since the environments between the PC and the ATE are very different, a desired reproduction is not obtained. In addition, the above system is so expensive.

SUMMARY OF THE INVENTION

Accordingly, it is an object of the present invention to provide a PC(Personal Computer) and ATE(Automatic Test Equipment) integrated chip test equipment which overcomes the problems encountered in the conventional art.

It is another object of the present invention to provide a PC and ATE integrated chip test equipment which is capable of designing a PC and ATE integrated chip device test equipment in which two processes are performed in one equipment.

It is still another object of the present invention to provide a PC and ATE integrated chip test equipment which is capable of enhancing a test performance and decreasing a test time by concurrently performing two processes.

It is still another object of the present invention to provide a PC and ATE integrated chip test equipment which is capable of decreasing an error ratio and a fabrication cost based on the advantages of a PC and ATE.

To achieve the above objects of the present invention, there is provided a PC and ATE integrated chip test equipment in which a PC test equipment evaluated under an actual use environment and an ATE using a test pattern are integrated.

To achieve the above objects of the present invention, there is provided a PC and ATE integrated chip test equipment which includes a PC(Personal Computer) test equipment which tests a chip device under a PC environment formed of a CPU and chip sets, a pattern generation substrate in which a processor is designed in an EPLD in order for a chip device to be pattern-programmed, an ATE (Automatic Test Equipment) which generates a test pattern using the pattern generation substrate and performs a test using the generated test pattern, and a power generation unit which supplies a power to the PC test equipment and ATE for thereby performing two processes of the PC test and ATE operation in one equipment.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The preferred embodiments of the present invention will be described with reference to the accompanying drawings.

Figure 1:
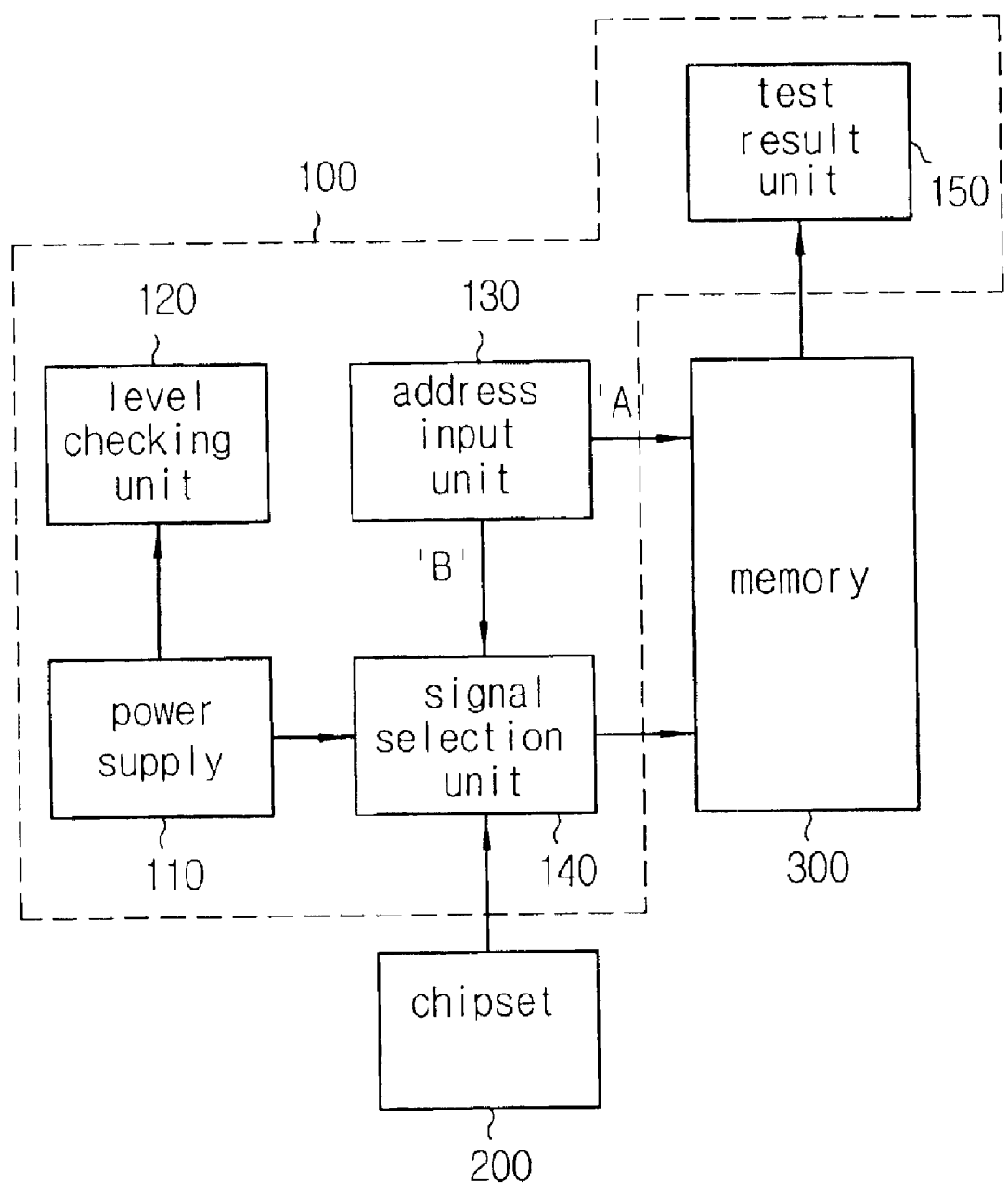
FIG. 1 is a view illustrating the construction of a conventional memory module test system.
Figure 2:
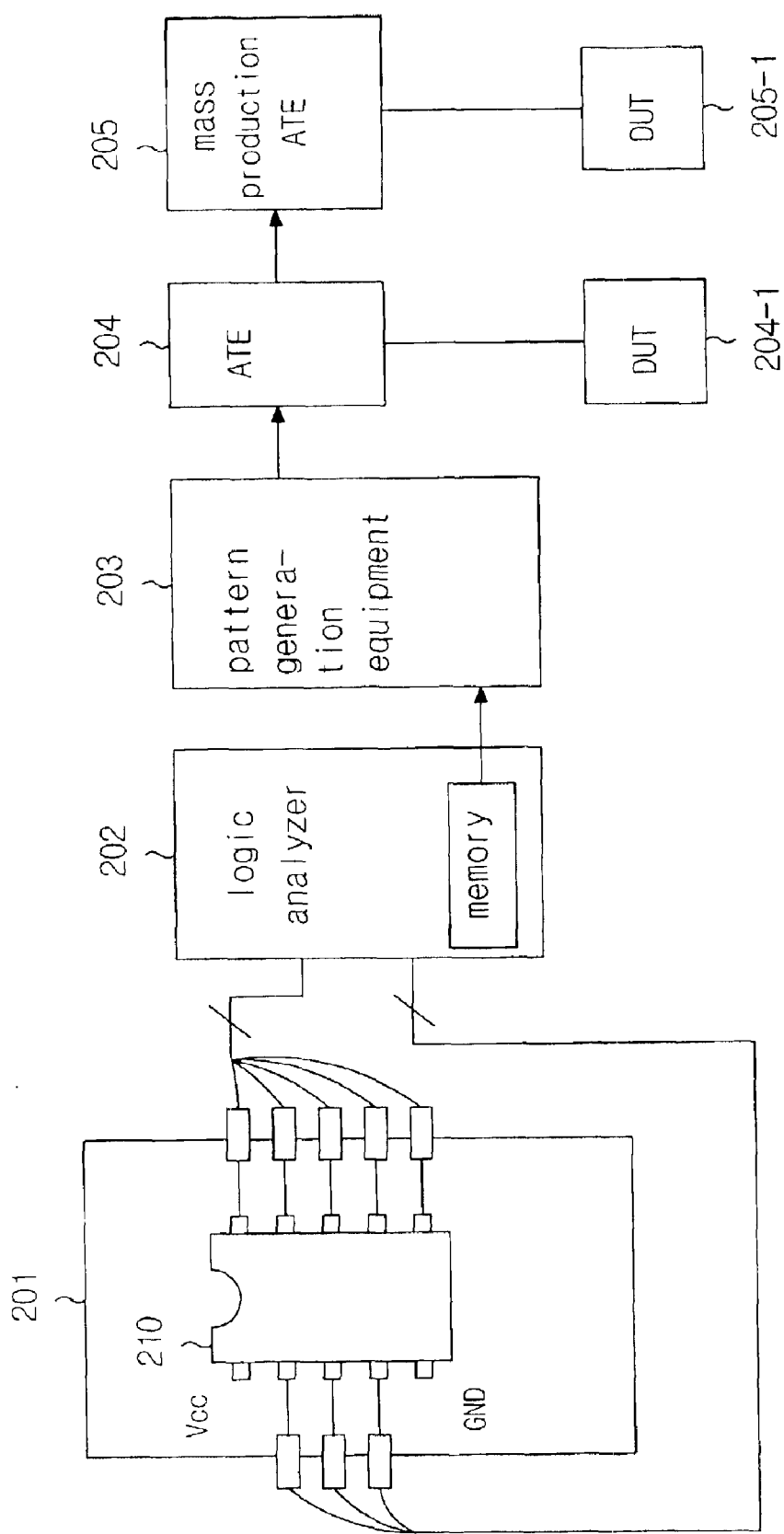
FIG. 2 is a block diagram illustrating a test system of a conventional chip equipment.
Figure 3:
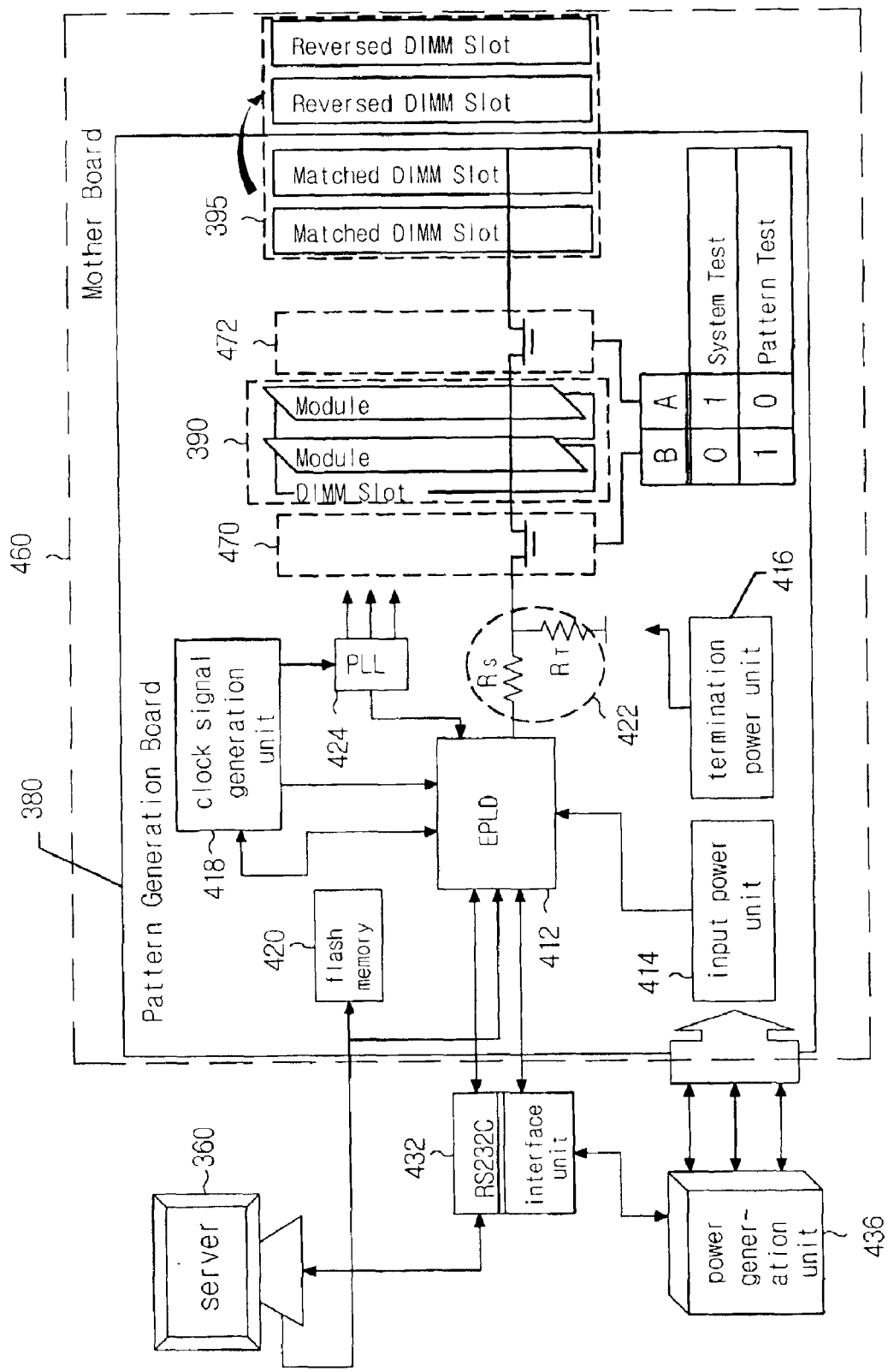
FIG. 3 is a block diagram illustrating a PC and ATE integrated chip test equipment according to the present invention.

FIG. 3 is a block diagram illustrating the construction of a PC and ATE integrated chip test equipment according to the present invention.

In the present invention, a PC test equipment and an ATE(Automatic Test Equipment) are integrated on a motherboard 460 formed of a CPU and chip sets by designing a processor in an EPLD 412 for thereby implementing a pattern programming operation under the same environment as a PC environment, so that a memory pattern test is implemented. A module test is performed by inserting a memory module in a DIMM slot 390. In addition, a component test is performed by connecting an interface board having a socket.

The present invention is formed of a CPU and chip sets connected with the CPU and controls a data transfer and logic between peripheral chips. In the motherboard 460, there are provided chips, sockets and slots for inserting parts thereinto, and connection terminals for connecting cables. A program written by a user in the PC test and server 360 is transferred to a test board. A program is performed in a pattern generation substrate 380, so that a test pattern is generated for performing a memory test. The generated test pattern is outputted to a memory. The pattern tests outputted to the memory are integrated for thereby concurrently performing two processes. The result of the test is checked in the server 360. The processor capable of implementing a pattern program is designed in the EPLD 412. High speed switching devices 470 and 472 are connected to the pattern generation substrate apparatus 380 which is capable of implementing a memory pattern test, so that the PC test and pattern test are concurrently performed in one equipment. In the power generation unit 436 capable of supplying a power to the PC and ATE, a dummy memory module is inserted into the motherboard 460 for thereby performing a PC test. In this case, the PC system operates as a server. In a state that the power is not disconnected, the pattern test is directly performed.

As shown in FIG. 3, in the present invention, the pattern generation substrate 380 and the motherboard of a main substrate are connected by a DIMM slot 395 into which a memory is inserted for thereby concurrently performing a PC test equipment and ATE.

In the pattern generation substrate 380, in the server 330, the program written by the user is transferred to the test board 360 through a RS232C interface 332, and the program is performed in the pattern generation substrate 310 for thereby generating a test pattern for a memory test and outputting to the memory. A result of the test is transferred to the server 330.

The pattern generation substrate 380 uses a programmable logic device(EPLD) 412 instead of a chip set on the board which is constructed like an actual environment.

The EPLD 412 implements a read and write operation using one chip which is designed to operate based on itself pattern algorithm and adjusts a timing of a signal supplied to the a chip device.

The EPLD 412 includes a server 360 which compiles itself test language, and a processor which receives a program from the server 360 and generates a pattern by executing the received program and generates a desired timing with respect to the memory. The EPLD 412 is connected with a flash memory 420 using a backup memory which is capable of storing a program.

The input power unit 414 which receives voltages of 5V, 3.3V and 2.5V from a programmable power generation unit(PPC) 436 and supplies to the EPLD 412 supplies the power to the EPLD 412 as well as a memory and a clock signal generation unit 418.

The programmable clock generation unit 418 adjusts a feed back signal input and output terminal and a timing of a clock signal and generates a real time clock signal and supplies to the EPLD and is constructed in the same construction as that of the PC environment.

The phase of a clock signal is synchronized using a phase locked loop(PLL) which is capable of setting a phase difference between the clock signal from the EPLD 412 and a feed back signal to zero. In the case that the test is performed by inserting a memory module into the DIMM slot 390 which is to constructed based on the JEDEC standard, a synchronized clock signal is inputted into the memory module for thereby performing a module test. A socket mounted interface board is connected to the DIMM slot 390 of the pattern generation substrate 380.

A high speed EPLD 412 used in the pattern generation substrate 380 uses a termination resistor 422 for thereby minimizing the distortion of a signal based on an impedance matching.

The termination resistor 422 is well adapted to a characteristic of an actual signal transmission like the pattern generation substrate 380 according to the present invention and has an impedance of 10 ohm through 100 ohm through the termination power unit 416.

The RS232C interface 432 transfers a test program from the server 360 to the EPLD 412 and transfers a result of the test to the server 360.

Namely, the pattern generation substrate 380 is connected with the above described elements for thereby implementing a test with respect to all memories. In addition, a programming is implemented based on a test language and a complier.

The processor is designed for thereby performing a test program using the EPLD 412, and a chip device is evaluated under an actual environment, and a pattern program is implemented. In the case that a plurality of EPLD 412 are used, it is possible to test a plurality of memory modules and components.

The pattern generation substrate 380 using the EPLD 412 and the motherboard 460 including the chip sets are connected using the DIMM slot 395. Therefore, it is possible to concurrently perform two processes in one equipment using high speed switching devices 470 and 472 which are capable of implementing a conversion of a signal between a signal line extended from the EPLD 412 and a signal line extended from the chip sets of the motherboard 460 without a signal distortion.

Namely, in the case of a PC test, a high speed switching device 472 in the side of the chip set of the motherboard 460 is turned on, and a high speed switching device 470 in the side of the pattern generation substrate is turned off. Therefore, the test is performed based on a test language and a complier. On the contrary, a high speed switching device 470 in the side of the pattern generation substrate is turned on, and a high speed switching device 472 in the side of the chip set of the motherboard 460 is turned off for thereby generating a test pattern used in the ATE which is capable of testing a chip memory. Therefore, it is possible to perform two processes of the PC and ATE in one equipment based on the above operation.

As described above, in the present invention, the processor is designed for thereby implementing a PC test and a pattern programming for a chip device test, so that a memory pattern test is performed. In the present invention, it is possible to implement two processes in one equipment. Therefore, it is possible to enhance a test performance and decrease the test time and fabrication cost. The error ratio of the products is decreased.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A PC and ATE integrated chip test equipment for testing a chip device, comprising:

a PC(Personal Computer) test equipment which tests a chip device under a PC environment formed of a CPU and chip sets;

a pattern generation substrate in which a processor is designed in an EPLD in order for a chip device to be pattern-programmed;

an ATE(Automatic Test Equipment) which generates a test pattern using the pattern generation substrate and performs a test using the generated test pattern; and a power generation unit which supplies a power to the PC test equipment and ATE for thereby performing two processes of the PC test and ATE operation in one equipment.

2. The equipment of claim 1, wherein said pattern generation substrate includes:

a high speed switching device which is capable of implementing a conversion and separation between the signal lines extended from a chip set installed in the motherboard connected with the pattern generation substrate and the DIMM slot and extended from the EPLD without a signal distortion for thereby testing two processes in one equipment.

3. The equipment of claim 1, wherein said power generation unit is shared with a PC test equipment and ATE and is capable of directly converting to a pattern test without disconnecting the power based on the operation that the PC system operates as a server after the PC test is finished by inserting a dummy memory in the motherboard.

4. The equipment of claim 1, wherein in the pattern generation substrate, a memory module test is implemented by inserting a memory module through a DIMM slot, and a component test is implemented through an interface board having a socket, and the above test is implemented with respect to all memories by inserting a memory.

* * * * *